US011043265B2

(12) United States Patent
Li et al.

(10) Patent No.: US 11,043,265 B2
(45) Date of Patent: Jun. 22, 2021

(54) MEMORY DEVICES WITH VOLATILE AND NON-VOLATILE BEHAVIOR

(71) Applicant: Hewlett Packard Enterprise Development LP, Houston, TX (US)

(72) Inventors: Zhiyong Li, Foster City, CA (US); Lu Zhang, Palo Alto, CA (US); Minxian Zhang, Mountain View, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 196 days.

(21) Appl. No.: 16/072,575

(22) PCT Filed: Feb. 12, 2016

(86) PCT No.: PCT/US2016/017693
§ 371 (c)(1),
(2) Date: Jul. 25, 2018

(87) PCT Pub. No.: WO2017/138951
PCT Pub. Date: Aug. 17, 2017

(65) Prior Publication Data
US 2019/0043562 A1    Feb. 7, 2019

(51) Int. Cl.
*H01L 27/10*    (2006.01)
*G11C 11/54*    (2006.01)
(Continued)

(52) U.S. Cl.
CPC ............. *G11C 11/54* (2013.01); *G06N 3/063* (2013.01); *G11C 5/02* (2013.01); *G11C 11/5685* (2013.01);
(Continued)

(58) Field of Classification Search
CPC combination set(s) only.
See application file for complete search history.

(56) References Cited

U.S. PATENT DOCUMENTS 8,515,885 B2   8/2013 Modha
8,694,452 B2   4/2014 Aparin et al.
(Continued)

OTHER PUBLICATIONS

Calayir, V. et al., Analog Neuromorphic Computing Enabled by Multi-Gate Programmable Resistive Devices, (Research Paper), Mar. 9-13, 2015, 4 Pages.
(Continued)

*Primary Examiner* — Moin M Rahman
(74) *Attorney, Agent, or Firm* — Sheppard Mullin Richter & Hampton LLP

(57) ABSTRACT

An example device in accordance with an aspect of the present disclosure includes an active oxide layer to form and dissipate a conductive bridge. The conductive bridge is to dissipate spontaneously within a relaxation time to enable the memory device to self-refresh according to volatile behavior in response to the input voltage being below a threshold corresponding to disregarding sneak current and noise of a crossbar array in which the memory device is to operate. The conductive bridge is to persist beyond the relaxation time to enable the memory device to retain programming for neuromorphic computing training according to non-volatile behavior of the memory device in response to the input voltage not being below the threshold.

12 Claims, 6 Drawing Sheets

(51) Int. Cl.
    *G11C 11/56*     (2006.01)
    *G06N 3/063*     (2006.01)
    *G11C 5/02*     (2006.01)
    *G11C 13/00*     (2006.01)

(52) U.S. Cl.
    CPC ...... *G11C 13/0002* (2013.01); *G11C 13/0011* (2013.01); *G11C 2213/77* (2013.01)

(56) References Cited

U.S. PATENT DOCUMENTS

| | | |
|---|---|---|
| 8,835,272 B1 | 9/2014 | Mickel et al. |
| 8,909,576 B2 | 12/2014 | Akopyan et al. |
| 8,982,647 B2 | 3/2015 | Nazarian et al. |
| 2011/0310656 A1 | 12/2011 | Kreupl et al. |
| 2012/0011090 A1 | 1/2012 | Tang et al. |
| 2012/0280224 A1 | 11/2012 | Doolittle et al. |
| 2013/0311413 A1 | 11/2013 | Rose et al. |
| 2014/0293678 A1 | 10/2014 | Orlowski et al. |
| 2014/0321197 A1* | 10/2014 | Ninomiya .......... G11C 13/0069 365/148 |
| 2015/0046382 A1 | 2/2015 | Rangan |
| 2017/0110177 A1* | 4/2017 | Lee .................. G11C 11/40615 |

OTHER PUBLICATIONS

International Searching Authority, International Search Report and Written Opinion for PCT Application No. PCT/US2016/017693, dated Nov. 4, 2016, 9 pgs.

* cited by examiner

MEMORY DEVICES WITH VOLATILE AND NON-VOLATILE BEHAVIOR

BACKGROUND

Although memristor-based crossbar array hardware can be used to represent a synapse weight matrix in neuromorphic computing, sneak path currents and noise associated with the crossbar array can cause errors in the training and the overall performance of the perceptron. Accordingly, the training can be inaccurate, with weights and/or conductance states of memristors in the array not matching intended values. Sneak path currents, thermal noise, process variations, and other issues can create cumulative effects in memristors of the array to increase the inaccuracy, especially for untargeted memristors that are incidentally affected during training of a targeted memristor being programmed, thereby accumulating inaccuracies in many memristors across the array. Although compensation can be used later to address some inaccuracies, compensation needs an accurate model of memristor devices and predicted error tolerance ranges. More importantly, compensation brings a need for a huge amounts of computational resources to update the state of each memristor device of the entire crossbar array after training. And even with compensation, it cannot be guaranteed that the training is accurate, because of mathematical limitations of existing models and error predictions.

BRIEF DESCRIPTION OF THE DRAWINGS/FIGURES

DETAILED DESCRIPTION

Example implementations described herein can provide a neuromorphic computing hardware system that uses a crossbar array with volatile/non-volatile resistive memory devices, also referred to as volatile conducting bridges (VCBs), at each intersection. Behavior of example memory devices resembles the operation of biological synapses, such that the example memory devices solve the major problem of crossbar-based perceptron hardware architectures (e.g., caused by sneak path current, random noise and other variations) for neuromorphic computing. Furthermore, the example implementations can disregard such variations and therefore do not need extra compensation techniques for undoing the cumulative effects of those variations by updating computing conductance states, unlike memristor-based approaches.

The example implementations of memory devices include non-volatile behavior (analogous to a "remembering" effect), as well as an aspect of volatility, analogous to a "forgetting" effect of neurons/brains in nature. In this manner, examples described herein may provide bimodal volatile memristive-based random-access memory (RAM) device architecture for neuromorphic computing hardware applications. The example bimodal memory devices can be fabricated in a similar manner as memristors, and the example crossbar array structures can be easily fabricated and integrated with input/output circuits, to realize perceptron functions in machine learning applications. For example, example implementations described herein of systems using example memory devices have a simpler structure, compared to a more complicated "selector+memristor" approach, with example systems being relatively easier to operate to achieve expected accurate training.

Figure 1:
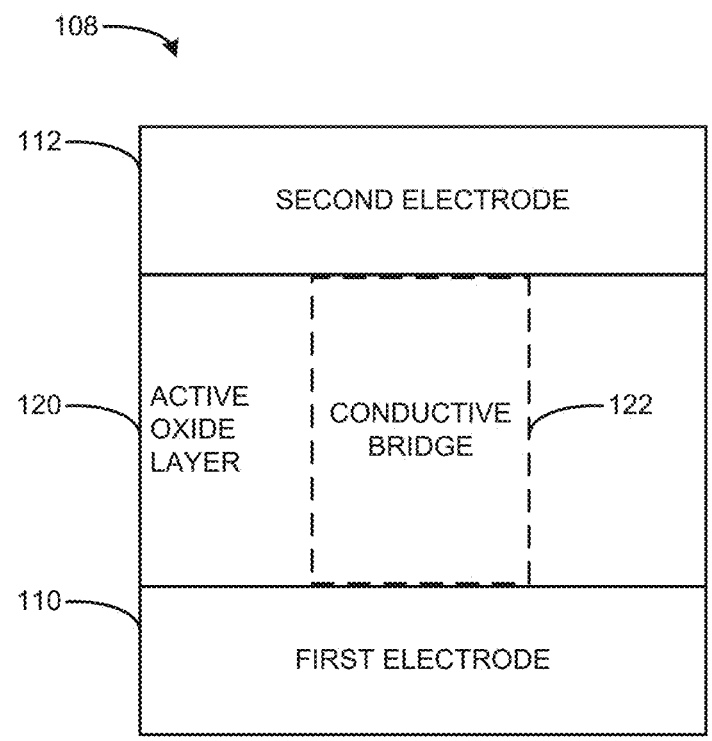
FIG. 1 is a block diagram of a memory device including a first electrode, an active oxide layer, and a second electrode according to an example.

FIG. 1 is a block diagram of a memory device 108 including a first electrode 110, an active oxide layer 120, and a second electrode 112 according to an example. The active oxide layer 120 can interact with the first electrode 110 and/or the second electrode 112 to develop a conductive bridge 122. The characteristics of the conductive bridge 122 enable the memory device 108 to have non-volatile and volatile switching behaviors. For example, when an input signal is small (e.g., below a threshold), the memory device 108 can forget the learning from that small input signal, resulting in no memory effect. But when the input signal is stronger, the memory device 108 can follow non-volatile behavior to remember the effect of the input signal.

In some example implementations, the memory device 108 is for neuromorphic computing. The first electrode 110 can include copper metal, to form and dissipate copper filaments in the active oxide layer 120 as part of forming the conductive bridge 122. The active oxide layer 120 is disposed on the first electrode 110 to form and dissipate the conductive bridge 122 in response to an input voltage based on interaction with the first electrode 110 to provide ion mobility within the active oxide layer 120. The active oxide layer 120 can be made of silicon oxide (SiOx) or other materials. The second electrode 112 is disposed on the active oxide layer 120. The first electrode 110 and the active oxide layer 120 enable the conductive bridge 122 to dissipate spontaneously within a relaxation time, to enable the memory device 108 to self-refresh according to volatile behavior in response to the input voltage being below a threshold. The threshold is to correspond to disregarding sneak current and noise of a given crossbar array in which the memory device 108 is to operate. For example, the memory device 108 can be tailored to operate according to a first threshold associated with a first crossbar array, based on characteristics of the first and second electrodes 110, 112 and active oxide layer 120. The first electrode 110 and the active oxide layer 120 also enable the conductive bridge 122 to persist beyond the relaxation time, to enable the memory device 108 to retain programming for neuromorphic computing training according to non-volatile behavior of the memory device 108 in response to the input voltage not being below the threshold. Thus, the memory device 108 can provide bimodal operation, and use volatile behavior to disregard incidental sneak current, noise, and other variations, while relying on non-volatile behavior to retain intended programming.

The bimodal memristive-based RAM memory device 108, also referred to as a volatile conducting bridge (VCB) device, is a two-terminal oxide-based device. The first and second electrodes 110, 112 can be chosen from metals that exhibit a high ion mobility within the active oxide layer 120. In an example implementation, the fabricated device structure consists of a bottom (first) electrode 110 formed of titanium and copper (Ti/Cu) layers, with a Ti layer of 2 nanometers (nm), and a Cu layer of 25 nm (e.g., the Ti can act as an adhesion layer for the Cu layer, without needing to produce ions for operation of the memory device 108). The active oxide layer 120 can be formed of $Cu_2O$ and/or SiOx (including combinations of different layers within the active oxide layer 120, see layers 220A and 220B in FIG. 2). The top (second) electrode 112 can be formed of copper and/or platinum (Cu/Pt) layers, with a Cu layer of 5 nm and a Pt layer of 25 nm (e.g., the Pt layer can provide capping for the Cu layer to prevent Cu oxidation in air, and to provide electrical conductivity, without needing to produce ions for operation of the memory device 108). The electrode material can be Cu or Ag, due to their high ion mobility inside SiOx. Other electrode materials can be used, e.g., for active oxide layers 120 of other materials, to obtain the desired interaction between electrode(s) and the active oxide layer 120.

The operational mechanism of the bimodal memory device 108 is based on the forming and dissipation of the conducting bridge, which can form inside the active oxide layer 120 in response to an input signal (e.g., under voltage stress). For example, when a positive voltage is applied on the memory device 108, the conductive bridge 122 can be formed (e.g., formed by Cu ions). If the input voltage is less than an operational threshold, the memory device 108 shows typical conductance volatility, i.e., the memory device 108 will self-refresh to return to its original state after a relaxation time when the input signal voltage is removed. The mechanism can involve a tip of the conductive bridge that is very weak and consists of Cu ions, which will diffuse quickly and lead to an OFF state of the memory device 108 after the relaxation time. That volatility resembles the forgetting effect of a biological synapse. If the input voltage is above the threshold, the memory device 108 can behave as a regular memristor to achieve a nonvolatile memory state. The input signal voltage, which meets or exceeds the threshold, can build a strong conducting bridge (and bridge tip), such that it is difficult for the Cu conducting bridge to dissipate, causing the device to be non-volatile.

Such bimodal behavior ensures that the memory device 108 provides volatile behavior to forget undesirable inputs (e.g., incidental sneak current, noise, and other variations), while retaining desired training inputs. The device can therefore offer analog performance desirable for neuromorphic training behavior, by providing a response/output that is proportional to input. However, the memory device 108 can disregard input signals falling under the threshold, avoiding accumulated effects, thereby ignoring sneak current, noise, or other variations. Thus, in response to input voltages not falling below the threshold, the memory device 108 can provide an analog mode of operation whereby output of the memory device 108 is proportional to input according to an accumulated effect. At input voltages below the threshold, the memory device 108 does not provide the analog mode of operation, because it can disregard sneak current and noise without exhibiting the accumulated effect, due to self-refreshing during the relaxation time. Thus, the memory device 108 can retain programming in a first state according to non-volatile behavior of the memory device 108 based on a first input voltage not lower than the threshold. The memory device 108 also can retain programming in a second state according to non-volatile behavior of the memory device 108 based on accumulating a second input voltage, not lower than the threshold, applied to enhance the first state. Such bimodal behavior is valuable for efficient and accurate neuromorphic computing applications.

Figure 2:
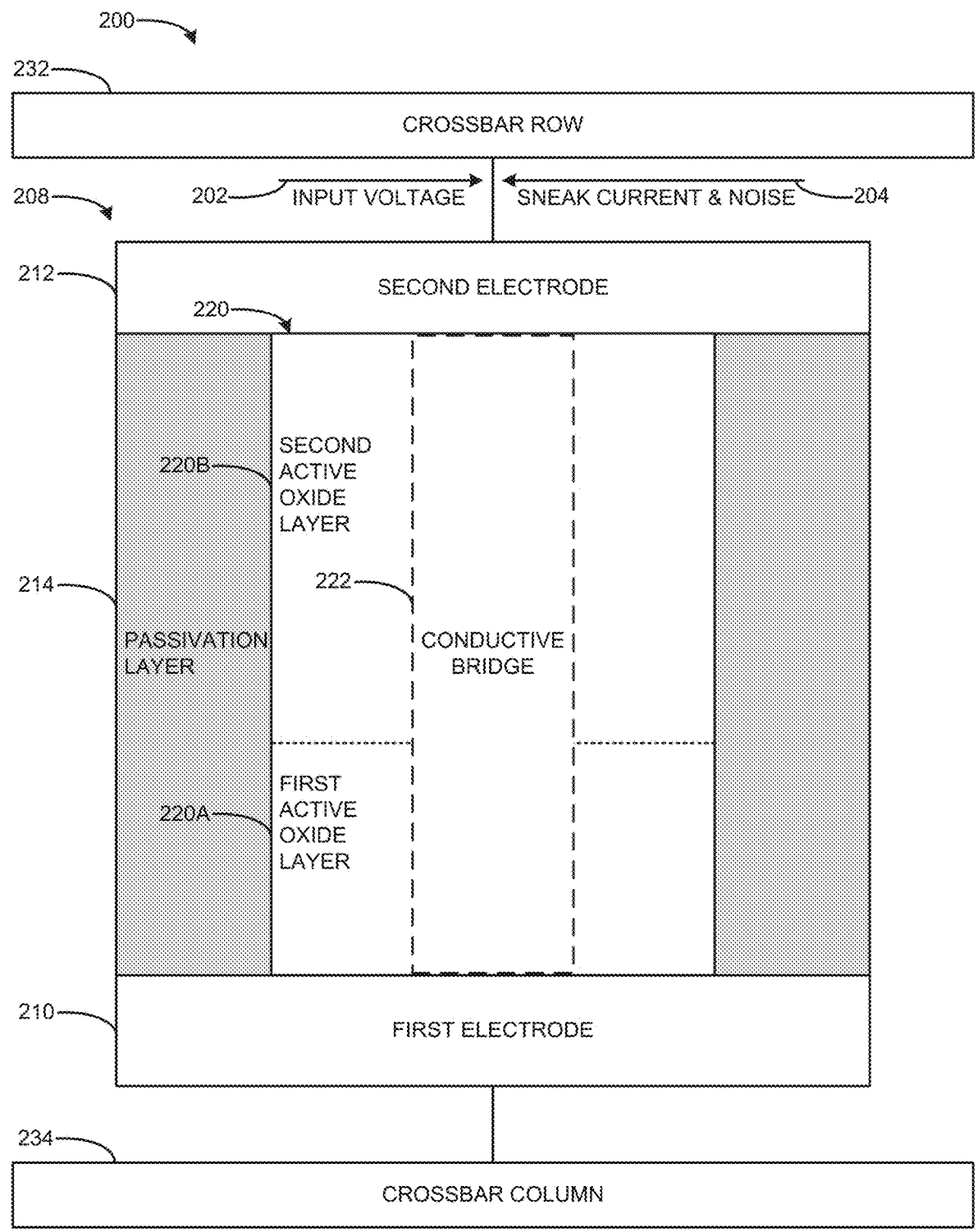
FIG. 2 is a block diagram of a system including a memory device, a crossbar row, and a crossbar column according to an example.

FIG. 2 is a block diagram of a system 200 including a memory device 208, a crossbar row 232 from a crossbar array, and a crossbar column 234 from the crossbar array according to an example. The memory device 208 is coupled to the crossbar row 232 via a first electrode 210, which is exposed to input voltage 202, as well as sneak current and noise 204, from the crossbar array. The active oxide layer 220 is disposed between the first electrode 210 and a second electrode 212, and includes first active oxide layer 220A and second active oxide layer 220B. In some example implementations, the active oxide layer 220 includes the first active oxide layer 220A having a first doping profile, and the second active oxide layer 220B having a second doping profile different than the first doping profile (the first and second active oxide layers can be different thicknesses from each other). The conductive bridge 222 is to form in the active oxide layer 220 based on interaction between the active oxide layer 220 and the first electrode 210 and/or the second electrode 212. Passivation layers 214 are disposed on the active oxide layer 220 between the first and second electrodes 210, 212. The passivation layer can passivate the memory device cell (serving as an interlayer dielectric layer), formed around the active oxide layer 220 to surround the active oxide layer 220. In some example implementations, the passivation layer 214 is disposed on portions of the active oxide layer 220 that are not in contact with the first electrode 210 and the second electrode 212, to protect the active oxide layer 220.

Operation of the memory device 208 based on the conductive bridge 222 can involve ionic migration of ions (e.g., Cu) from the first electrode 210, and electron migration of electrons from the input voltage 202. The conductive bridge 222, according to volatile operation of the memory device 208, is to dissolve in response to removal of the input voltage 202 that is below the threshold, based on the second electrode 212 serving as an ionic sink to absorb ions from the first electrode 210. The conductive bridge 222 can include a formed portion, such as Cu, extending into the active oxide layer 220. The conductive bridge 222 can include volatile and non-volatile portions, such as a tip that forms/dissolves depending on operational voltage, and a trunk that can survive changes in operational voltage.

The first and second electrodes 210, 212 can be formed from one material or a plurality of materials. In some example implementations, an electrode can be formed with multiple layers, such as a layer of titanium facing away from the active oxide layer 220, and a layer of copper or silver facing toward the active oxide layer 220. Titanium can serve as an adhesion layer to promote adhesion between copper and a substrate, enabling the second electrode 212 to adhere to a substrate (not shown). The first electrode 210 can include a layer of copper and a layer of platinum, where the platinum layer can provide electrical contact and cap the Cu from oxidation in air. The first and second electrodes 210, 212 can be formed of single materials, such as the second electrode 212 being formed of a single layer of platinum, copper, silver, gold, etc. In addition to providing electrical conductivity, the first and/or second electrodes 210, 212 can serve as a source and/or sink for the ions that interact with the active oxide layer 220 to participate in formation and dissipation of the conductive bridge 222. For example, application of the input voltage 202 to the first electrode 210 pushes copper (or other metal/material, such as silver) ions from the first electrode 210 into the active oxide layer 220. The second electrode 212 can act as a sink to absorb the ions released from the active oxide layer 220.

The active oxide layer 220 can be formed of various materials such as oxides including silicon oxide (SiOx), titanium oxide, hafnium oxide, tantalum oxide, zirconium oxide, spin on glass polymer-based silicon oxides such as siloxene-type compounds, and others. The active oxide layer 220 is shown divided into two regions, e.g., regions having different doping profiles of a given oxide, or two different types/flavors of oxides. As illustrated, the different regions of the active oxide layer 220 (first and second active oxide layers 220A, 220B) which do not need to be evenly doped, can be formed of different thicknesses, and do not need to be formed of the same thickness (although in alternate example implementations, such doping and/or thickness formation is possible).

The passivation layer 214 can be formed as a dielectric, referred to as an interlayer dielectric (ILD) layer. The passivation layer 214 is to protect the active oxide layer 220.

In operation, a filament of ions (e.g., Cu) can start to form in the active oxide layer 220 as the conductive bridge 222. The filament begins to bridge across the active oxide layer 220 from the second electrode 212 to the first electrode 210. The filament can grow or shrink depending on operational conditions, such as geometry of the different components, their chosen materials, and input signals applied or not applied.

Application of an external voltage such as the input voltage 202, from the first electrode 210 to the second electrode 212, can initially result in ionic migration. For example, Cu (or other material such as silver) ions can move from the first electrode 210 to the active oxide layer 220, such that the ions form a conductive path, and then electrons can pass across the conductive path. Thus, the memory device 208 can provide the conductive bridge 222 in two stages, with ionic migration first, and then once a conductive bridge is formed, electron migration can take place. Electron migration can cause volatile or non-volatile behavior. When the channel formed by the conductive bridge 222 is permanent, then the memory device 208 can operate as non-volatile. This channel can dissolve spontaneously when the external input voltage 202 is removed, turning off the conductive path and resulting in a volatile off state of the memory device 208. When the input voltage 202 is applied again, the memory device 208 can turn on again. Such combination of ionic migration and electron migration enables device operations. In some example implementations, Cu ions can move quickly and interstitially through the silicon oxide of the active oxide layer 220. The Cu ions have positive charge, either a +1 or a +2 positive charge per ion. Then, once the quick ions form the conductive path, electrons can flow through the conductive bridge 222.

Figure 3:
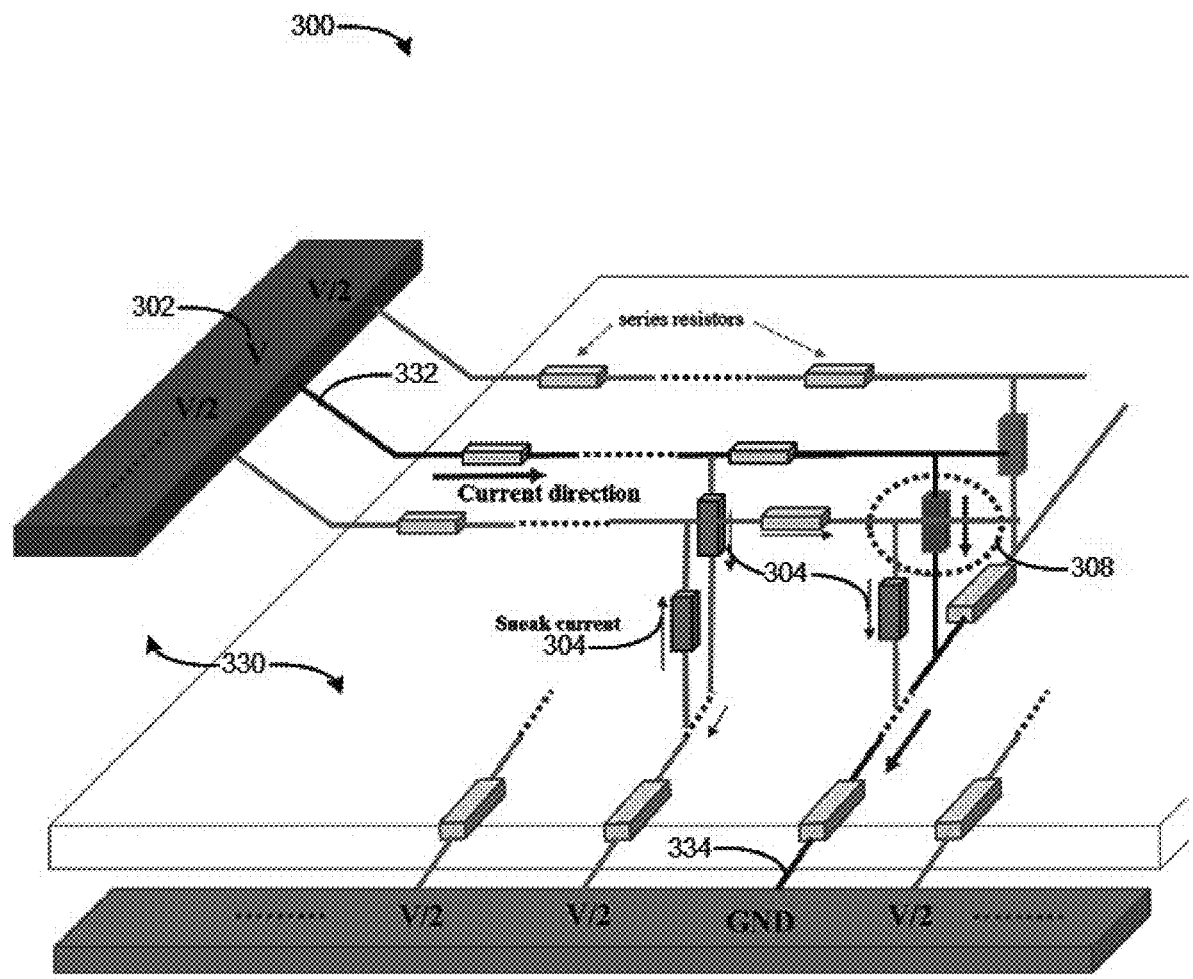
FIG. 3 is a block diagram of a system including crossbar array and a plurality of memory devices according to an example.

FIG. 3 is a block diagram of a system 300 including crossbar array 330 and a plurality of memory devices 308 according to an example. The crossbar array 330 includes a plurality of crossbar rows 332 and a plurality of crossbar columns 334, with memory devices 308 coupled between. A selected memory device 308 can undergo programming based on input voltage 302 being applied on its corresponding crossbar row 332, and ground being applied on its corresponding crossbar column 334. Such programming of a given memory device 308 can result in incidental sneak currents 304, noise, and other variations being experienced by other memory devices that are not currently being programmed.

The illustrated operation of the crossbar-based neuromorphic computing training process shows the incidental sneak current influence problem with crossbar structures. Existing sneak currents on the crossbar array generate noise across memory devices during the training process, potentially risking inaccuracies as a result of the voltages on untargeted memory devices being non-zero in each training. However, example implementations of bimodal memory devices described herein can be designed to have a threshold that is above such non-zero voltages associated with a given crossbar array. Accordingly, the untargeted memory devices 308 can remain unchanged during training, based on the volatile and non-volatile properties of the memory devices 308. Because the surrounding memory devices on the crossbar array structure experience sneak currents, noise, and other variations below the threshold, the surrounding memory devices can react in a volatile manner (self-refresh after a relaxation time) to effectively disregard/ignore such variations without accumulating a corresponding non-volatile effect.

In operation, the current direction can flow from the input circuit of the column, based on input voltage (V) 302, through series resistors, and then through the memory device 308 under training, to the output sensing circuit, based on the voltage GND. However, other non-targeted devices during training can experience the sneak current 304. A memristor, unlike the example bimodal memory devices 308 described herein, would therefor accumulate conductance state changes over time in each training epoch due to the sneak current passing through untargeted devices. The example bimodal memory devices 308, however, exhibit bimodal volatile memristive/RAM behavior that can enable the memory devices 308 to remain in their original states (after a relaxation time) in view of the variations, without accumulating changes in conductance, effectively ignoring the sneak current and noise.

Thus, in an example implementation, a system 300 for neuromorphic computing using a crossbar array can include memory devices 308 disposed in the crossbar array 330 for programming according to training. A memory device targeted by an input voltage 302 is to behave as non-volatile, and memory devices 308 that are untargeted are to behave as volatile to self-refresh to disregard sneak current 304 and noise. A given memory device 308 is to self-refresh according to volatile behavior in response to the input voltage 302 being below a threshold, corresponding to sneak current 304 and noise of a given crossbar array 330 in which the memory device 308 is to operate. The given memory device 308 is to retain programming for neuromorphic computing training according to non-volatile behavior in response to the input voltage 302 not being below the threshold.

The crossbar array 330 can use a half-select scheme as illustrated in FIG. 3, using full value voltage 302 on a selected cell to be programmed, and using half value voltage (e.g., V/2) on non-selected cells. The threshold for memory devices (separating volatile and non-volatile behavior of the memory device) can be set between the full value voltage V and the half value voltage V/2.

Accordingly, neuromorphic computing hardware systems such as system 300 can take real world signals and perform functions similar to biological behavior, realized by artificial neural network algorithms using weight matrices which store information of synapse weights using a crossbar array to represent a weight matrix. With a proper input and output sensing circuit, the crossbar array can implement a functional perceptron. To achieve well-performing perceptron hardware, the training process is applied on the crossbar array to map in useful "knowledge" (represented by the synapse weights), which is similar to the learning process of a brain. A weight matrix is first computing and the matrix elements are mapped to the crossbar array memory devices 308. The training procedure is performed by iterating the training on each individual memory device 308, with different tuned programming pulse durations used on a given memory device 308. This process builds the "memory" of the crossbar array, with different memory devices 308 trained or tuned to different conductance states. When the training is completed, the perceptron is achieved, and can be used to do pattern recognition, prediction, etc., which are important and popular in machine learning applications.

Depending on how strongly the input voltage 302 is applied, different weights can be programmed into the various memory devices 308. Additional input signals can be applied to a given memory device to enhance its signal/weight, based on the example memory devices exhibiting proportional analog non-volatile behavior in response to inputs at or above the threshold. Thus, the plurality of memory devices 308 can be programmed using the neuromorphic computing training and self-refreshing, to disregard effects of sneak current and noise, without a need to apply a compensation afterward to undo effects of sneak current and noise.

In an example implementation for training, before the training starts, the crossbars (e.g., one for a positive weight matrix, and the other for a negative weight matrix) are prepared, and all devices are tuned to OFF states. During the training procedure, the sneak-current-induced voltages on untargeted devices are relatively small compared the chosen threshold for the memory devices 308, according to calculations on the network of series resistors and memory devices 308. In addition, the noise induced voltages also are relatively small, compared to the chosen threshold voltage of the memory devices 308. Thus, the response will be volatile for those untargeted memory devices 308, allowing the targeted device 308 (exposed to the input voltage 302 V and GND) to be trained. The threshold for the memory device 308 can be chosen such that the targeted memory device 308 is trained under a voltage that is above the threshold voltage, which is also less than an ideal input voltage (sneak current path effect). Other untargeted memory devices 308 remain unchanged after the relaxation time to enable the "self-refreshing" of memory devices 308 when a new training epoch begins. For those memory devices 308 that are already trained, because they are in a non-volatile state, they are not easily disturbed.

The self-refresh effect for a given memory device 308 corresponds to the conductance decay of the memory device 308, and can be on the order of microseconds or less (depending on device characteristics and/or programming). This enables the system 300 to avoid a need for compensation and the associated intense computation for the crossbar structure to determine how to compensate for errors that would otherwise accumulate on devices unlike the example implementations that provide self-refresh and do not need compensation. The example system 300 also avoids errors that would otherwise be associated with not knowing what the actual state is of a given device.

The threshold for the memory devices 308 can be set between the half voltage select and full voltage select, such that sneak currents fall below the threshold. Additionally, the threshold can be set to be relatively low, enabling the system to operate at a lower overall power, while still providing a sufficient read margin/operational margin between the half-select and full-select values. In an example implementation, the threshold for memory devices 308 can be set as on the order of 1 V or slightly less.

For neuromorphic computing, the memory device behavior can be tailored and improved/optimized. The thickness of device components/layers can be varied, the thickness of the conductive bridge and how fast it can dissolve/dissipate can also be varied. The material composition of the memory devices can be varied, using different oxides and/or different moving species/ions (e.g., based on selection of electrode material). The threshold can be chosen reasonably low for power efficiency, but not too low to sacrifice margins. Additionally, the relaxation time can be adjusted to provide desired self-refresh performance. In some example implementations, the relaxation time for bimodal memristive-based RAM (volatile switching) memory devices 308 can be on the order of microseconds. Such a relatively small self-refresh time, compared to the hardware operation time intervals, enables example systems 300 to neglect the "state drift" of untrained memory devices caused by sneak current 304, achieving more accurate training results on the crossbar array 330 compared to a memristor-based crossbar array suffering from various drawbacks described above.

Figure 4:
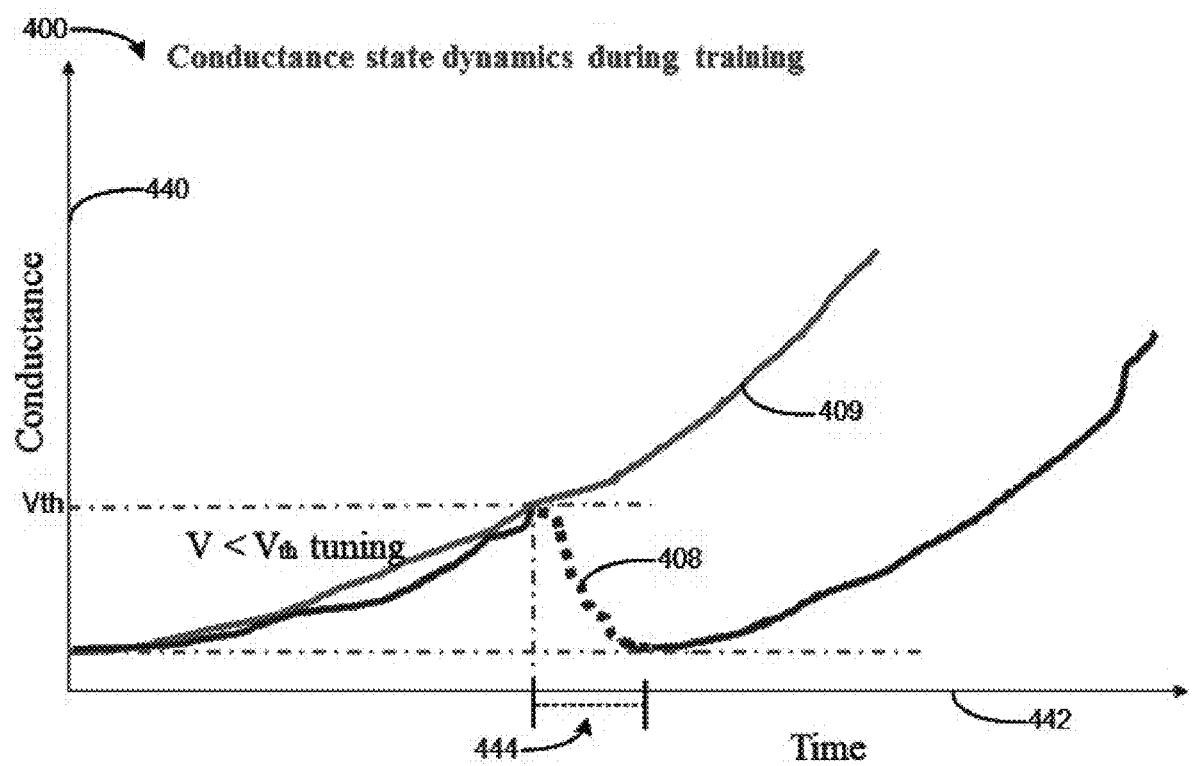
FIG. 4 is a chart illustrating conductance state dynamics as a function of conductance vs. time according to an example.

FIG. 4 is a chart 400 illustrating conductance state dynamics as a function of conductance 440 vs. time 442 according to an example. The behavior of a memristor 409 is shown in light gray, compared to an example bimodal memory device 408 shown in dark gray. Unlike example memory devices, the memristor 409 exhibits non-volatility for values of input voltage, even those below a threshold voltage Vth, showing conductance state accumulation over time, with accumulated error inescapably growing upward overtime. However, the example bimodal memory device 408 exhibits volatility for those voltages below Vth, by self-refreshing during the relaxation time 444 and returning to a base conductance state, such that accumulated error over time is ignored from sneak currents and noise resulting from training induced errors. Thus, errors accumulate in memristor-based crossbars illustrated by line 409, while no such errors accumulate in the example bimodal memristive based (VCB) RAM memory devices 408.

The relaxation time 444 is substantially on the order of a microsecond or less. After the relaxation time 444 for voltages below Vth, the conductance of the memory device 408 will decay to the initial value. Accordingly, during a single training, the conductance error will automatically decay to its original starting value after the relaxation time 444, without accumulating aggregate averages. Thus, throughout training, the various incidental voltages less than threshold Vth can be disregarded by the surrounding untargeted memory devices, regardless of how much accumulated error is generated over time.

Figure 5:
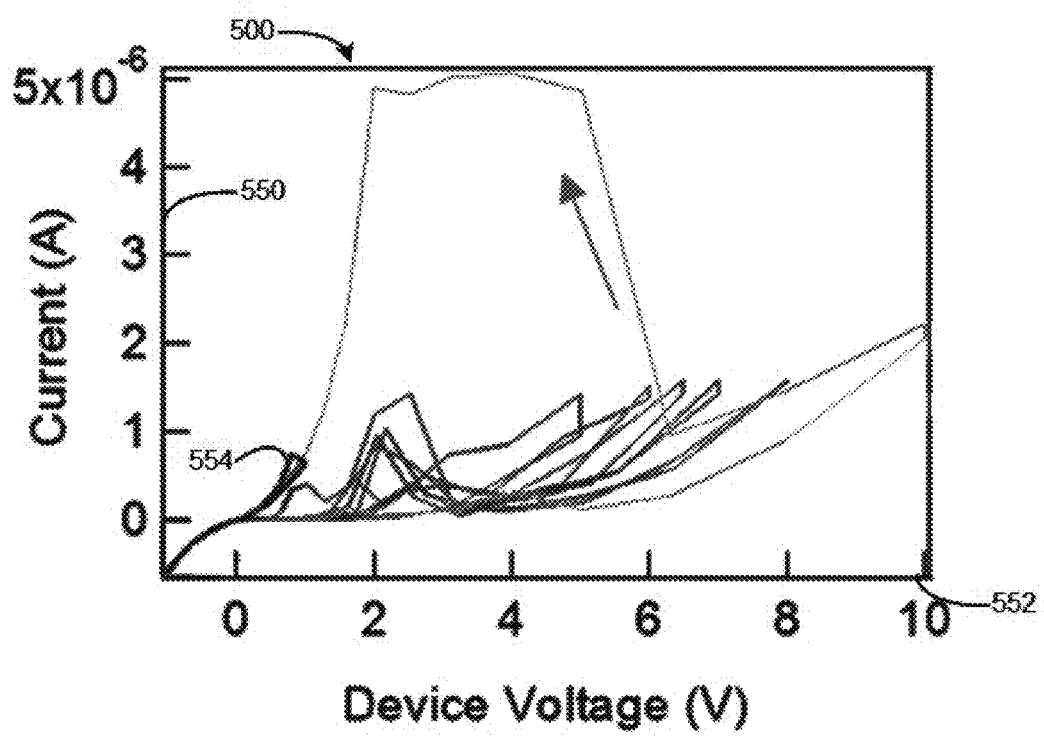
FIG. 5 is a chart illustrating a function of current vs. device voltage for a device in a non-volatile ON state according to an example.

FIG. 5 is a chart 500 illustrating a function of current 550 vs. device voltage 552 for a device in a non-volatile ON state according to an example. The bimodal memristive based RAM (VCB) memory device has an intrinsic threshold voltage which controls the boundary of volatility (forgetting effect) and non-volatility (memory effect). The chart 500 illustrates non-volatile ON switching under high voltage, whereby the reading curve 554 confirms that the memory device remains in an ON state (i.e., following the lighter upward curve by exhibiting an increasing/upward current 550 as device voltage 552 increases, instead of following a flat curve. Generally, a given device in an off state can be switched on, and then can be switched further on. Thus, the memory device can learn a first state, and another additional signal can be used to enhance the learning of the first state to a second state.

Figure 6:
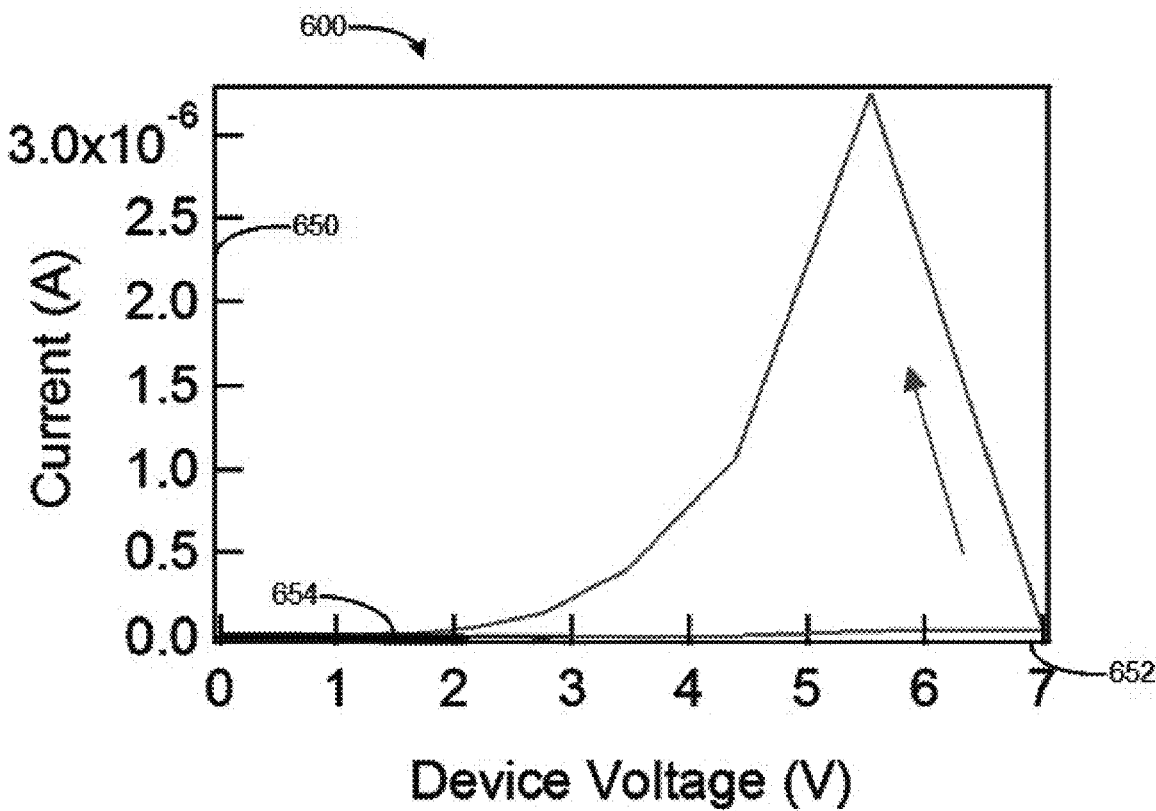
FIG. 6 is a chart illustrating a function of current vs. device voltage for a device in a volatile ON state showing a faster decay of conductance under lower input voltage according to an example.

FIG. 6 is a chart 600 illustrating a function of current 650 vs. device voltage 652 for a device in a volatile ON state showing a faster decay of conductance under lower input voltage according to an example. The volatile ON switching below the threshold voltage is illustrated by a faster decay of conductance, under lower input voltage, as shown by the black reading curve 654 showing that the memory device is in an OFF state after volatile ON switching.

Figure 7:
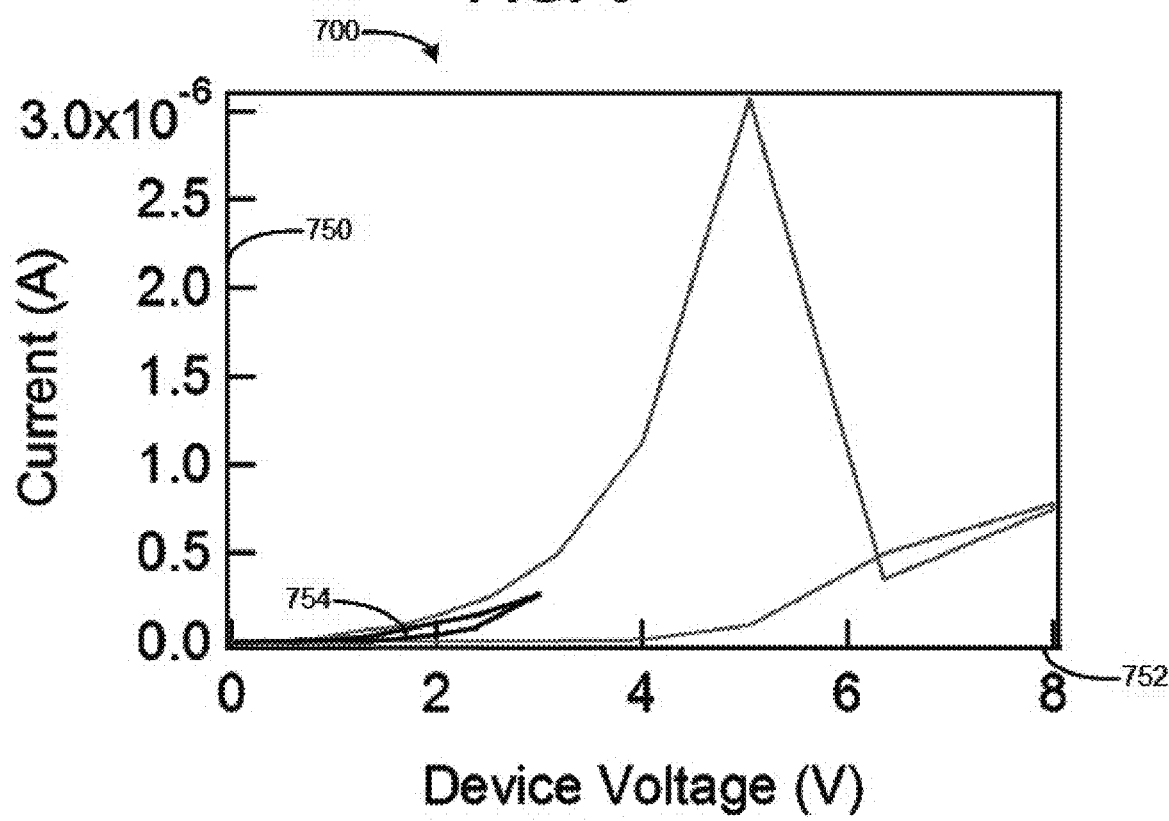
FIG. 7 is a chart illustrating a function of current vs. device voltage for a device in a volatile ON state showing a slower decay of conductance under higher input voltage according to an example.

FIG. 7 is a chart 700 illustrating a function of current 750 vs. device voltage 752 for a device in a volatile ON state showing a slower decay of conductance under higher input voltage according to an example. The volatile ON switching below the threshold voltage is illustrated by a slower decay of the conductance, under higher input voltage, as shown by the black reading curve 754 showing that the memory device is in the decay process after volatile ON switching.

Figure 8:
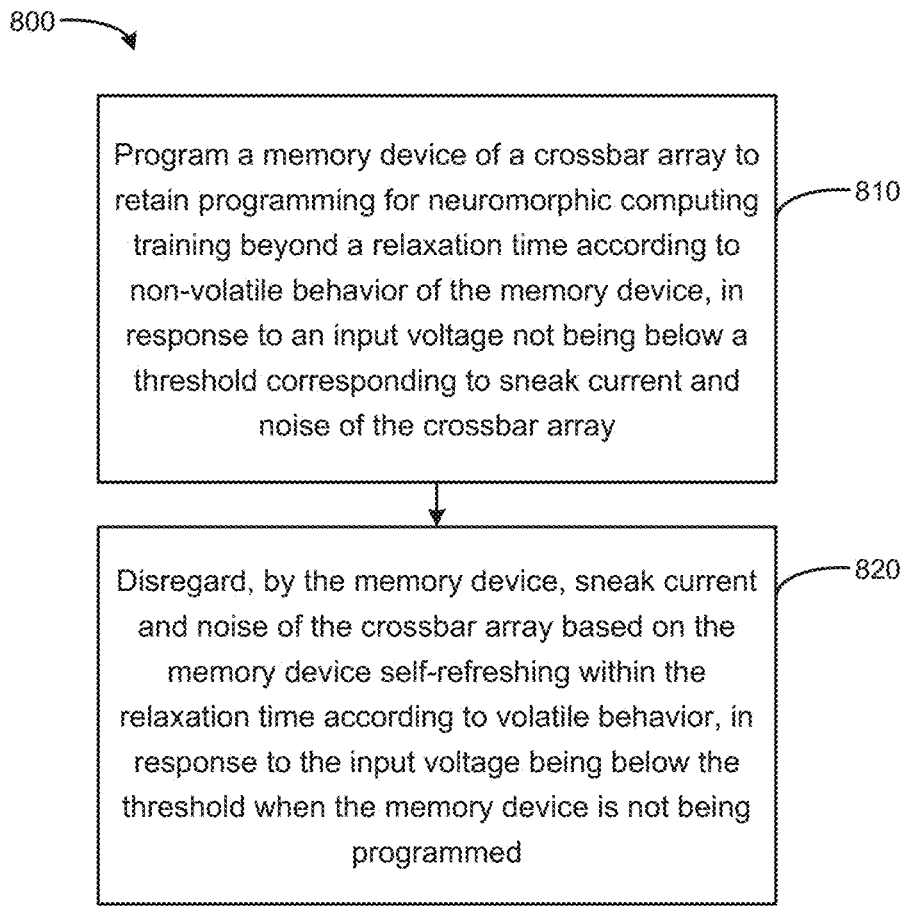
FIG. 8 is a flow chart based on programming a memory device according to an example.

Referring to FIG. 8, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 8 is a flow chart 800 based on programming a memory device according to an example. In block 810, a memory device of a crossbar array is programmed to retain programming for neuromorphic computing training beyond a relaxation time according to non-volatile behavior of the memory device. The non-volatile behavior is in response to an input voltage not being below a threshold corresponding to sneak current and noise of the crossbar array. For example, the memory device can be designed to have a threshold between a full voltage and a half-select voltage of a given crossbar array, such that the memory device will exhibit non-volatile (i.e., programmable) behavior in response to input signals at or above the threshold value. Accordingly, the memory devices can be selected and programmed for neuromorphic computing training by using an input voltage at or above the threshold.

In block 820, the memory device is to disregard sneak current and noise of the crossbar array based on the memory device self-refreshing within the relaxation time according to volatile behavior, in response to the input voltage being below the threshold when the memory device is not being programmed. For example, those memory devices in the crossbar array that are not targeted for programming can experience incidental sneak current, noise, and other variations during the training process. However, the memory devices are designed to have a threshold below which inputs are disregarded, allowing the memory devices to self-refresh without a need for a computationally intensive compensation procedure.

Accordingly, the example memory devices enable efficient programming for neuromorphic computing, retaining programming as intended, and disregarding incidental effects, based on forming and dissipating a conductive bridge inside an oxide layer of the memory device due to interaction between the oxide layer and an electrode(s) of the memory device in response to an input voltage.

What is claimed is:

1. A memory device for neuromorphic computing, comprising:
   a first electrode;
   an active oxide layer disposed on the first electrode to form and dissipate a conductive bridge in response to an input voltage based on interaction with the first electrode to provide ion mobility within the active oxide layer; and
   a second electrode disposed on the active oxide layer;
   wherein the first electrode and the active oxide layer enable the conductive bridge to dissipate within a relaxation time to enable the memory device to self-refresh according to volatile behavior in response to the input voltage being below a threshold corresponding to disregarding sneak current and noise of a crossbar array in which the memory device is to operate; and
   wherein the first electrode and the active oxide layer enable the conductive bridge to persist beyond the relaxation time to enable the memory device to retain programming for neuromorphic computing training according to non-volatile behavior of the memory device in response to the input voltage not being below the threshold.

2. The memory device of claim 1, wherein active oxide layer comprises SiOx.

3. The memory device of claim 1, wherein the active oxide layer includes a first layer having a first doping profile, and a second layer having a second doping profile different than the first doping profile.

4. The memory device of claim 1, further comprising a passivation layer disposed on portions of the active oxide layer not in contact with the first electrode and the second electrode, to protect the active oxide layer.

5. The memory device of claim 1, wherein operation based on the conductive bridge includes ionic migration of ions from the first electrode, and electron migration of electrons from the input voltage.

6. The memory device of claim 1, wherein the conductive bridge is to dissolve in response to removal of the input voltage that is below the threshold, based on the second electrode serving as an ionic sink to absorb ions from the first electrode.

7. The memory device of claim 1, wherein the relaxation time is substantially on the order of a microsecond.

8. The memory device of claim 1, wherein the first electrode includes copper metal, and is to form and dissipate copper filaments in the active oxide layer.

9. The memory device of claim 1, wherein the memory device is to retain programming in a first state according to non-volatile behavior of the memory device based on a first input voltage not lower than the threshold, and retain programming in a second state according to non-volatile behavior of the memory device based on accumulating a second input voltage, not lower than the threshold, applied to enhance the first state.

10. The memory device of claim 1, wherein at input voltages not below the threshold, the memory device is to provide an analog mode of operation corresponding to output of the memory device being proportional to input according to an accumulated effect, and wherein at input voltages below the threshold, the memory device is to not provide the analog mode of operation, to disregard sneak current and noise and not exhibit the accumulated effect due to self-refreshing according to the relaxation time.

11. A memory device comprising:

a first electrode;

an active oxide layer disposed on the first electrode to form and dissipate a conductive bridge in response to an input voltage based on interaction with the first electrode to provide ion mobility within the active oxide layer; and a second electrode disposed on the active oxide layer;

wherein the first electrode and the active oxide layer enable the conductive bridge to dissipate within a relaxation time to enable the memory device to self-refresh; and wherein the first electrode and the active oxide layer enable the conductive bridge to persist beyond the relaxation time in response to the input voltage not being below the threshold, wherein the first electrode and the active oxide layer enable the conductive bridge to dissipate within a relaxation time to enable the memory device to self-refresh according to volatile behavior in response to the input voltage being below a threshold corresponding to disregarding at least one of sneak current and noise of a crossbar array in which the memory device is to operate.

12. The memory device of claim 11, wherein the first electrode and the active oxide layer enable the conductive bridge to persist beyond the relaxation time to enable the memory device to retain programming according to non-volatile behavior of the memory device.

* * * * *